United States Patent
Slamowitz et al.

(10) Patent No.: US 6,903,996 B2
(45) Date of Patent: *Jun. 7, 2005

(54) VERY SMALL SWING HIGH PERFORMANCE CMOS STATIC MEMORY (MULTI-PORT REGISTER FILE) WITH POWER REDUCING COLUMN MULTIPLEXING SCHEME

(75) Inventors: Mark Slamowitz, Chandler, AZ (US); Douglas D. Smith, Mesa, AZ (US); David W. Knebelsberger, Tempe, AZ (US); Gregory Djaja, Phoenix, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/340,066

(22) Filed: Jan. 10, 2003

(65) Prior Publication Data

US 2003/0099148 A1 May 29, 2003

Related U.S. Application Data

(63) Continuation of application No. 09/964,971, filed on Sep. 27, 2001, now Pat. No. 6,519,204.
(60) Provisional application No. 60/245,913, filed on Nov. 3, 2000.

(51) Int. Cl.[7] .................................................. G11C 8/00
(52) U.S. Cl. .................................. 365/230.05; 365/154
(58) Field of Search ............................. 365/230.05, 154, 365/189.02, 189.12, 205, 207, 230.02

(56) References Cited

U.S. PATENT DOCUMENTS

| | | | |
|---|---|---|---|
| 4,771,194 A | | 9/1988 | Van Zeghbroeck ......... 307/530 |
| 4,918,341 A | | 4/1990 | Galbraith et al. ............. 327/51 |
| 4,935,649 A | | 6/1990 | Bloker ........................ 327/51 |
| 4,943,945 A | | 7/1990 | Lai .............................. 327/51 |
| 5,065,363 A | | 11/1991 | Sate et al. ................... 365/154 |
| 5,189,640 A | * | 2/1993 | Huard ......................... 365/154 |
| 5,325,335 A | * | 6/1994 | Ang et al. ................... 365/205 |
| 5,477,489 A | * | 12/1995 | Wiedmann ............. 365/189.04 |
| 5,590,087 A | | 12/1996 | Chung ................... 365/230.05 |
| 5,650,971 A | * | 7/1997 | Longway et al. ........... 365/207 |
| 5,710,742 A | * | 1/1998 | Carter et al. ........... 365/230.05 |
| 5,724,299 A | * | 3/1998 | Podlesny et al. ...... 365/230.05 |

OTHER PUBLICATIONS

Izumikawa, M. et al., "A Current Direction Sense Technique For Multiport SRAM's", IEICE Transactions on Electronics, Institute of Electronics Information and Comm. Eng, Tokyo, JP, vol. E79–C, No. 7, Jul. 1, 1996, pp. 957–962, XP000632350.

* cited by examiner

*Primary Examiner*—Anh Phung
(74) *Attorney, Agent, or Firm*—McAndrews, Held & Malloy, Ltd.

(57) ABSTRACT

The present invention relates to storage element. At least one read port is coupled to the storage element and a sensing device is coupled to the read port, where the read port is coupled to the storage element in an isolated manner. The sensing device is adapted to sense a small voltage swing. The sensing device includes two inverters comprising input offset and gain stages.

35 Claims, 11 Drawing Sheets

Sense Amplifier

Column Mux Circuit

VERY SMALL SWING HIGH PERFORMANCE CMOS STATIC MEMORY (MULTI-PORT REGISTER FILE) WITH POWER REDUCING COLUMN MULTIPLEXING SCHEME

CROSS REFERENCE TO RELATED APPLICATIONS

This application is a continuation of patent application Ser. No. 09/964,971 filed Sep. 27, 2001 titled "Very Small Swing High Performance CMOS Static Memory (Multi-Port Register File) With Power Reducing Column Multiplexing Scheme", (Attorney Docket No, 13151US02), U.S. Pat. No. 6,519,204, issued Feb. 11, 2003, now Reexamination Ser. No. 90/006,803 filed Oct. 8, 2003, which is related to, and claims benefit of and priority from, Provisional Application Ser. No. 60/245,913 filed Nov. 3, 2000, titled "Very Small High Performance CMOS Static Memory (Multi-Port Register File) With Power Reducing Column Multiplexing Scheme", (Attorney Docket No. 13151US01), the complete subject matter of each of which is incorporated herein by reference in its entirety.

FEDERALLY SPONSORED RESEARCH OR DEVELOPMENT

[Not Applicable]

BACKGROUND OF THE INVENTION

One embodiment of the present invention relates to static multi-port memories or register files. More specifically, one embodiment of the present invention relates to very small swing CMOS SRAM having a column multiplexing scheme.

Currently, memories or register files are widely used in numerous applications in various industries. Although, typically it is desirable to incorporate as many memory cells as possible into a given area, some known memories or register files are often perceived as physically too large (i.e., they take up too much silicon area) and/or are too slow for a given product definition. In addition, power dissipation is another parameter that all memory designers are forced to consider in order to make a product cost effective.

One type of basic storage memory or register file is the CMOS static random access memory (alternatively referred to as the "SRAM"), which retains its memory state without refreshing as long as power is supplied to the cell. In one embodiment of a SRAM, the memory state is usually stored as a voltage differential within a bitable functional element such as an inverter loop.

Accordingly, there is a need for a memory or register file that doesn't take up too much silicon area in comparison to known memories or register files. There is a further need for faster memory or register files with improved power dissipation in comparison to known memories or register files.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

One embodiment of the present invention provides improved register file or uni-directional multi-port [i.e., dedicated write port(s) and dedicated read port(s)] memories having high speed, high density and moderate power dissipation for applications in the sub 16 kb (kilo bit) range when compared to currently available memories. One embodiment of the present invention increases density using, for example, a single-ended sense scheme. Using such a single-ended sense scheme saves routing channels and reduces overall transistor count in the storage element. For the applications mentioned above, the illustrated embodiment also improves read access time (higher density translates to less capacitance and hence higher speed for a given power level). Additionally, one embodiment of the present invention employs a sense amplifier technique, which reliably senses a significantly smaller static bitline swing, improving performance.

One embodiment of the present invention comprises a multi-port register file memory having at least one storage element, at least one read port coupled to the storage element and a sensing device coupled to the read port and adapted to sense a small voltage swing. The read port includes a pair of series transistors, for example NFet transistors, coupled together. The sensing device may be, for example, a sense amplifier including input offset and gain stages, where the input offset stage biases the gain stage defining a small bitline swing that is less than, or a small portion, of the total voltage supply, about 200 mV, for example.

In another embodiment, the register file memory includes a plurality of storage elements arranged in columns, where one read port is coupled to one or more of the storage elements. This embodiment may include for example, a column mux circuit coupled to one or more of the storage elements and the sensing device. In this embodiment, the read port includes a pair of series transistors and a sensing device coupled to the read port and adapted to sense a small voltage swing.

In yet another embodiment, a circuit for use with a memory having at least one storage element is contemplated. The circuit includes a read port coupled to the storage element and a sensing device coupled to the read port and adapted to sense a small voltage swing.

One embodiment for improving speed and performance is contemplated. In this embodiment, a method for improving speed and performance in a multi-port register file having plurality of storage elements is contemplated. In this method at least one of the storage elements is selected and a small voltage swing is sensed.

Yet another embodiment is contemplated for reading data. In this embodiment, a method for reading data stored in a multi-port register file memory having a plurality of memory elements arranged in columns is contemplated. In this method, one of the columns is selected, a current flows through at least one transistor to one of the storage elements in the column, and an output of a sense amplifier connected to the column is switched to a high state.

Other aspects, advantages and novel features of the present invention, as well as details of as illustrated embodiment thereof, will be more fully understood from the following description and drawings, wherein like numerals refer to like parts.

DETAILED DESCRIPTION OF THE INVENTION

One embodiment of the present invention provides a high speed, high density register file memory or SRAM with improved power dissipation (i.e., moderate) used in the 64 kb (kilo bit) or smaller range with a power supply voltage greater than 0 but less than about 2.00 volts, for example. The register file memory may, in one embodiment, be a uni-directional multi-port memory having dedicated write port(s) and dedicated read port(s) for applications in the 32 kb or smaller range with a power supply voltage between about 1.08 and about 1.32 volts, for example.

Figure 1A:
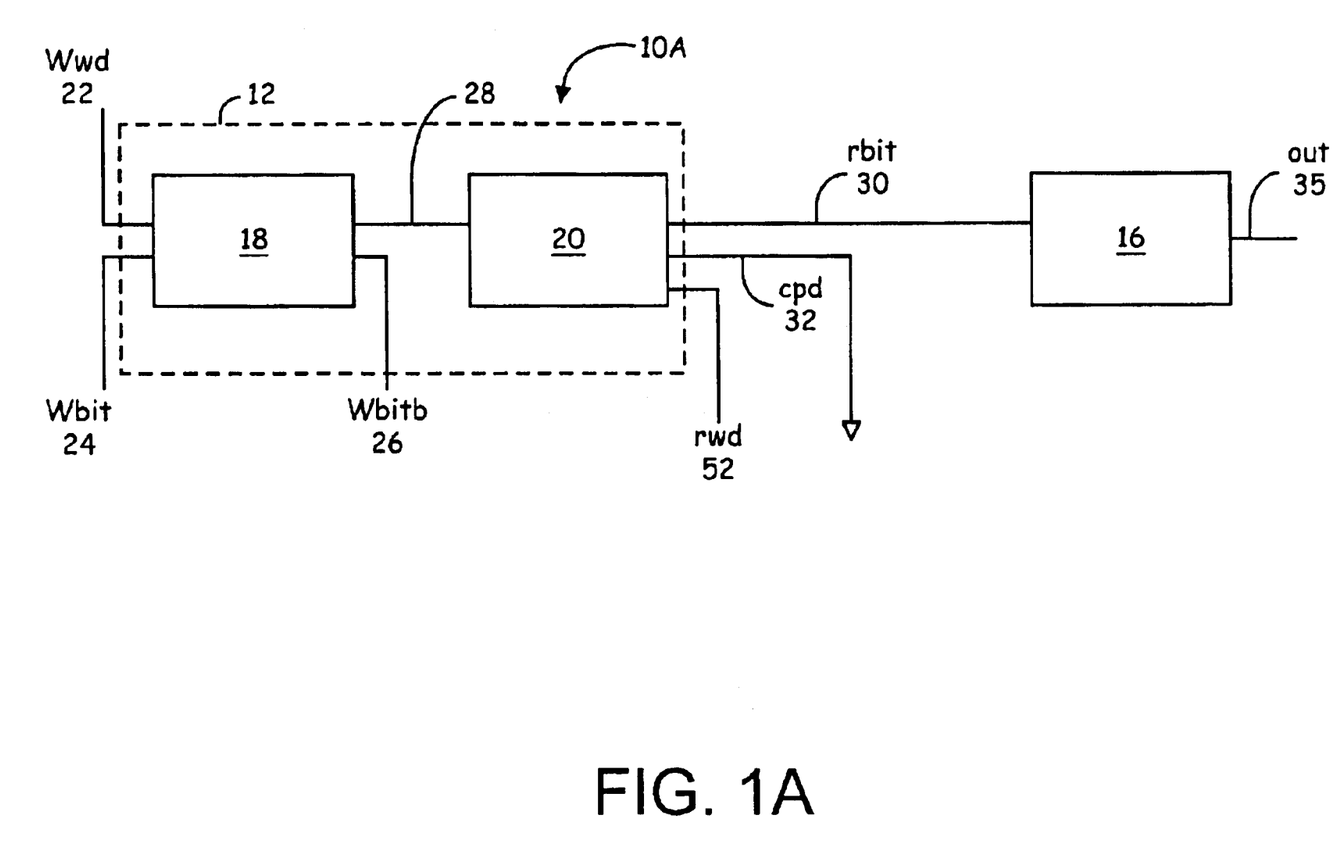
FIGS. 1A and 1B illustrate block diagrams of two embodiments of the high performance CMOS static memory (multi-port register file) in accordance with the present invention.
Figure 1B:
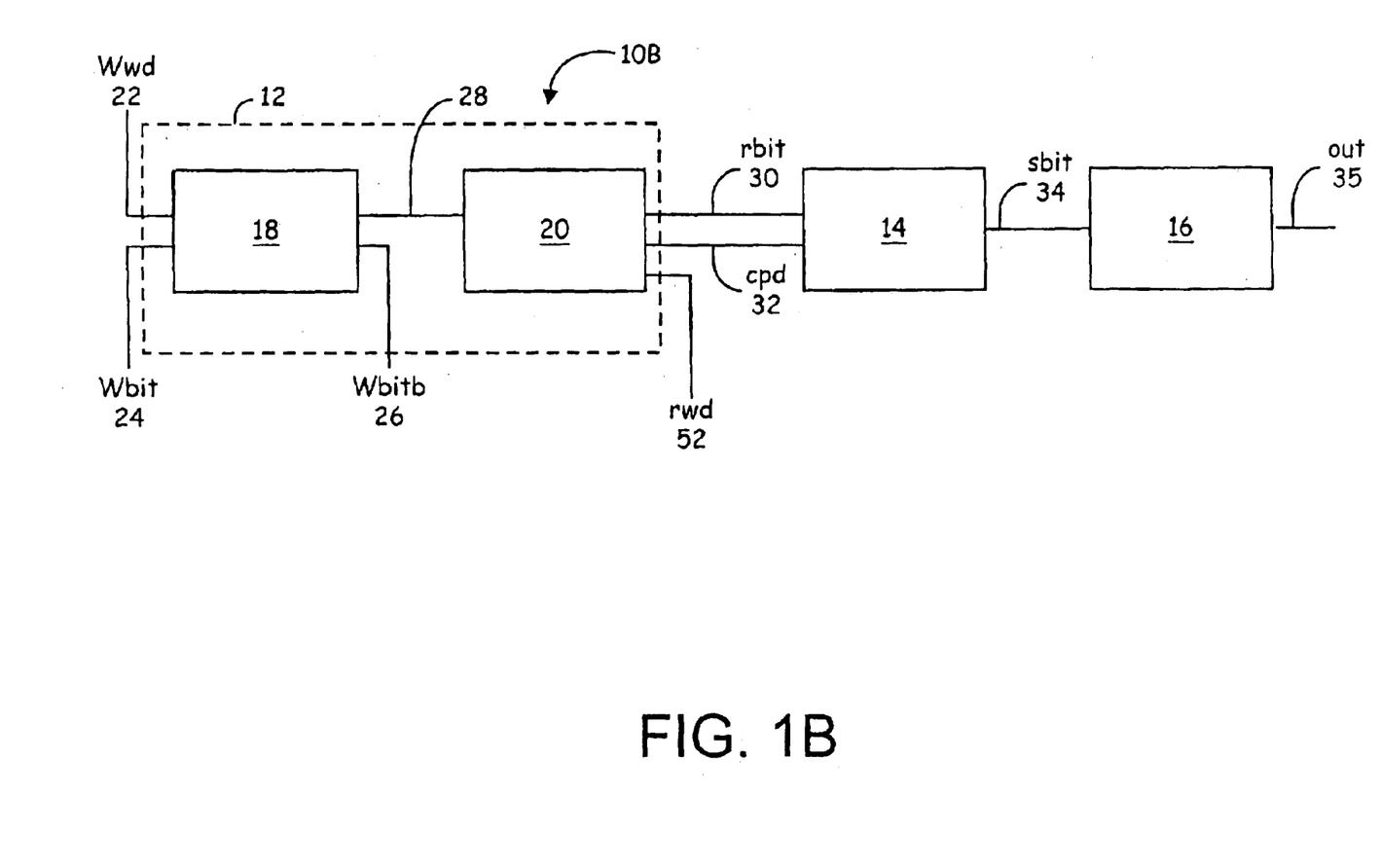

A block diagram of one embodiment of the present invention is illustrated in FIG. 1A. The CMOS static memory or multi-port register file memory, generally designated memory 10 although memories 10A and 10B are depicted in FIGS. 1A and 1B respectively, includes, for example, an 8T register file storage element 12 coupled to, connected to or otherwise electrically communicating with a column mux 14 (as illustrated in FIG. 1B) or directly to a sense device or amplifier 16 (as illustrated in FIG. 1A), although other arrangements are contemplated.

The memory 10 stores data (i.e., "words" and "bits per word") provided, for example, during a write process using a write path and at least the write bit line. The column mux 14 enables manipulating a non-performance optimized logical memory array into a more practical physical memory array implementation, by selecting one column from a plurality of columns. In other words, the column mux enables a plurality of columns to share outputs, where at least one column may be selected from the plurality of columns. If the plurality of columns did not share outputs, each column may require its own output. The sense device or amplifier 16 senses a small bitline voltage swing, increasing performance.

FIG. 1A further depicts a plurality of electrical connections or couplings. Electrical couplings wwd 22, write bit line 24 (alternatively referred to "wbit") 24 and wbitb 26 are shown coupled to storage element 18. Storage element 18 is coupled to read port 20 via coupling or connection 28. Rwd 52 is illustrated coupled to read port 20. In this embodiment, the memory 10A has no column mux (i.e., CM1, where each column is coupled to its own output channel), so read port 20 is coupled to the sense amplifier 16 via local read bit line 30 (alternatively referred to as "rbit"). Out or output line 35 is illustrated coupled or connected to sense amplifier 16.

The storage elements are, in this embodiment, arranged in a plurality of rows and in one column, with each column coupled to its own output channel, storing recorded information. The read ports are coupled to the storage elements in an isolated manner (i.e., the read ports don't affect the static stability of the storage element 18), enabling a plurality of the cells to be arranged in such plurality of rows and in one or more columns, storing the recorded information.

A first transistor of read port 20 (illustrated in FIG. 2) acts as the switch, selecting a particular row of storage elements 18 in a column to be read as discussed below. This transistor is coupled to rwd 52 and rbit 30. If pluralities of storage elements 18 are used in the column in memory 10, other storage elements 18 may be attached to the same read bitline. In the illustrated embodiment, only one row may be selected in the column at a time, so that only one read port 20 can be ON at a time.

In one embodiment of the present invention, the memory state is stored as a voltage differential within a bistable storage element such as an inverter loop. These storage elements are either in a low or high stored memory state. If the storage element is in a low stored state, recording new and opposite information changes the storage element to a high stored state (logic "0" or logic "1" respectively). If the storage element is in a high stored state (logic 1), recording new and opposite information changes the storage element to a low stored state (logic 0).

Once a row is selected, the data stored in the "selected" memory row location is determined by whether or not a second transistor in read port 20 is ON or OFF. In a low stored state for example, if the gate of the second transistor is high, then the transistors in the read port pair are ON and a current is passed by the read port pair. This current makes its way to rbit 30 directly coupled to the sense amplifier 16. If the gate of the second transistor is low, no current flows through the read port 20 and thus no current is supplied to the sense amplifier 16.

In this embodiment, the presence or lack of a current at the sense amplifier 16 determines the state of the selected memory location. The sense amplifier 16 senses or detects a current and outputs a corresponding voltage in order to communicate with the memory's full CMOS output stage. The sense amplifier is biased, enabling a small predetermined bitline swing. Having a small predetermined bitline swing reduces the amount of voltage required to fully switch the sense amplifier. The bitline swing is at least a portion of the total voltage supply. Such a small bitline swing is sufficient to almost fully switch the gain stage of the sense amplifier 16 to CMOS logic levels. An output stage follows the sense amplifier stage, fully restoring the voltage levels to interface with standard CMOS gating.

A block diagram of another embodiment of the present invention is illustrated in FIG. 1B. The CMOS static memory or multi-port register file memory 10B illustrated in FIG. 1B, in this example, includes a 10T register file storage element 12 coupled to, connected to or otherwise electrically communicating with a column mux 14 and sense amplifier 16.

In the embodiment illustrated in FIG. 1B, electrical couplings wwd 22, write bit line or wbit 24, wbitb 26 and coupling 28 are shown connected to storage element 18, similar to the embodiment illustrated in FIG. 1A. In this embodiment, the memory 10B has two or more columns per output channel (i.e., CM2 or more), and read port 20 is coupled to column mux 14 via rbit 30 and cpd 32. RWD 52 is coupled to the read port 20. Column mux 14 and the sense amplifier 16 are coupled via global read bit line or sbit 34. Again out 35 is connected to sense amplifier 16.

The storage elements are, in one example of this embodiment, arranged in a plurality of rows and in a plurality of columns and store the recorded information. Again, in this example, the read ports are coupled to the storage elements 18 in an isolated manner, so that the read ports don't affect the static stability of the storage element.

A first transistor of read port 20 (illustrated in FIG. 7) acts as a switch, selecting a particular row of storage elements 18 in each of the columns to be read as discussed below. This transistor is coupled to rwd 52 and rbit 30. If pluralities of storage elements 18 are used in each of the pluralities of columns, other storage elements 18 in the same column may be attached to the same read bitline 30. In this embodiment, only one row may be selected in each of the columns at a time, so that only one read port 20 per output channel can be ON at a time. In other words, only one read port per several columns has the ability to provide a current to sense amplifier 16.

Once a row is selected, the data stored in the "selected" memory row location is determined by whether or not a second transistor in read port 20 is ON or OFF. In the low stored state (logic 0), for example, if the gate of this transistor is high, then the transistors in the read port pair are ON and a current is generated through the read port pair. This current makes its way to the rbit 30 and its resulting effect to sbit 34 of the sense amplifier 16. If the gate of this second transistor is low, no current flows through the read port 20 and thus no current is supplied to the amplifier 16.

As provided previously, the presence or lack of a current at the sense amplifier 16 determines the state of the selected memory location. The sense amplifier 16 senses or detects the current and outputs a voltage in order to communicate with the memory's full CMOS output stage.

In one example of the embodiment illustrated in FIG. 1B, a plurality of columns (i.e., a multi-column mux register file memory) is contemplated as provided previously. Column muxing optimizes memories with many words but with relatively few bits per word. From both a topological as well as a performance perspective, column muxing provides flexible embedded memory solutions. A column mux circuit is used to implement such column muxing capability. This circuit is located conceptually between the memory core cells 12 and the sense amplifier 16. As should be apparent from the previous discussion and the figures, the number of column mux circuits is generally dependent on the number of columns and the number of bits per word.

Figure 2:
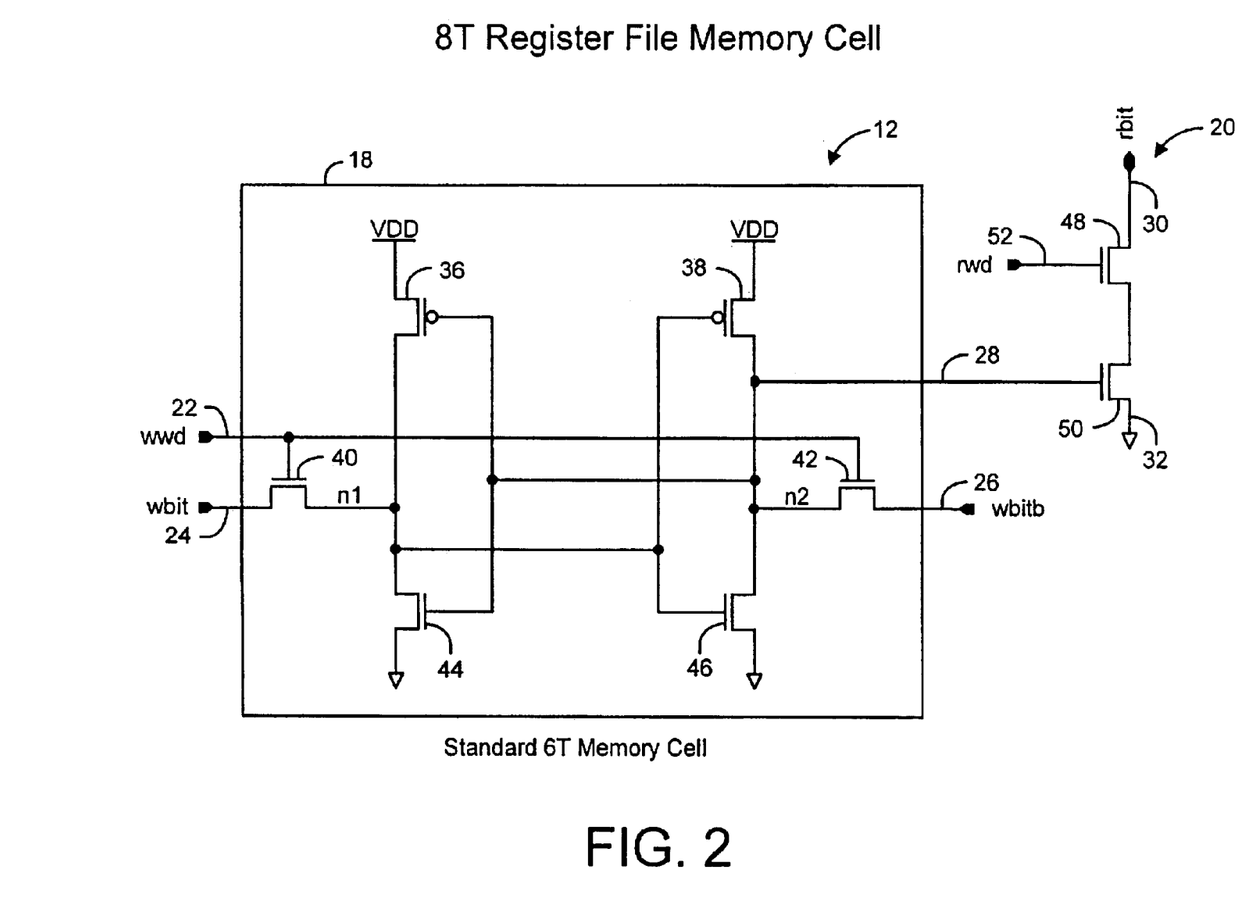
FIG. 2 illustrates one embodiment of an 8T storage element architecture in accordance with the present invention.

Referring to FIG. 2, one embodiment of the storage element 12 is illustrated having a 6T CMOS SRAM storage element 18 coupled to a read port 20. In one example, the 6T CMOS SRAM storage element 18 comprises two P channel field-effect transistors (Pfets) 36 and 38 and four N channel field-effect transistors (Nfets) 40, 42, 44 and 46. A Pfet transistor is turned on by a logic 0 at its gate and is adapted to pass or transmit a logic 1. An Nfet transistor is turned on by a logic 1 at its gate and is adapted to pass or transmit a logic 0.

It should be appreciated that the storage element 12 is either in a low or high stored memory state as provided above. If a logic 0 is stored (i.e., storage element 12 is in a low stored state) recording new and opposite information stores a logic 1 on the storage element (i.e., a high stored state). If a logic 1 is recorded on storage element 12 (i.e., storage element 12 is in a high stored state) recording new and opposite information records a logic 0 (i.e., changes the storage element to a low stored state).

The transistor 36 is illustrated coupled to VDD, to transistors 38, 42, 44 and 46 via its gate and to transistors 38, 40, 44 and 46 via its drain connection. Transistor 38 is illustrated coupled to VDD, to transistors 36, 40, 44 and 46 via its gate and to transistors 36, 42, 44 and 46, and the read port 20, via its drain connection.

Transistor 40 is illustrated coupled to at least the wbit 24 via its drain, to wwd 22 and transistor 42 via its gate, and to transistors 36, 38, 44 and 46 via its source connection. Transistor 42 is illustrated coupled to at least wbitb 26 via its drain, to wwd 22 and transistor 40 via its gate, and to transistors 36, 38, 44 and 46 via its source connection. Transistor 44 is illustrated coupled to least transistors 36, 38, 42, 46 and read port 20 via its gate and to transistors 36, 38, 40 and 46 via its drain connection. Transistor 46 is illustrated coupled to at least transistors 36, 38, 40, 44 via its gate and to transistors 36, 38, 42, 44 and read port 20 via its drain connection. Transistors 44 and 46 each have their sources tied to VSS or ground.

In one embodiment, the read port 20 comprises a pair of NFet transistors 48 and 50 in series, where storage element 18 is coupled to transistor 50 in an isolated manner, so that the read port does not affect the static stability of the storage element. More specifically, transistor 48 of read port 20 has its drain coupled to rbit 30, its gate to rwd 52 and its source to the drain of transistor 50. Transistor 50 is coupled to transistors 36, 38, 42, 44 and 46, respectively. Further, transistor 50 is coupled to cpd 32, which for the column mux of one is merely tied to ground as illustrated. This arrangement enables additional read ports 20 to be added to the cell 18 in the same isolated manner. This is desirable in that register files 10 often require numerous read ports that don't affect the static stability of the storage element 18 as provided previously.

The embodiments of FIGS. 1A, 1B and 2 reduce memory silicon area while improving speed in comparison to known memories or register files. Using the single-ended sense read port 20 as provided previously, the illustrated embodiment reduces routing channels and/or overall transistor count in the storage element 10, thus reducing the amount of required silicon area. The illustrated embodiment optimizes memory read access time since the high transistor density translates to less interconnect capacitance and hence higher speed for a given or specific power level.

Once a row is selected as provided previously, the data stored in the "selected" memory row location is determined by whether or not transistor 50 is ON or OFF. In a low stored state for example, if gate of transistor 50 is high (logic 1), transistors 48 and 50 are ON and a current is transmitted through the read port. Referring to FIG. 1B this current makes its way to the rbit 30 and its resulting effect to sbit 34 of the sense amplifier. If the gate of transistor 50 is low (logic 0), no current flows through the read port 20 and thus no current is supplied to the sense amplifier 16. The presence or lack of a current at the sense amplifier 16 is what determines the state of the selected memory location. The sense amplifier 16 senses a current and converts it into a voltage in order to communicate with the memory's full CMOS output stage.

Figure 3:
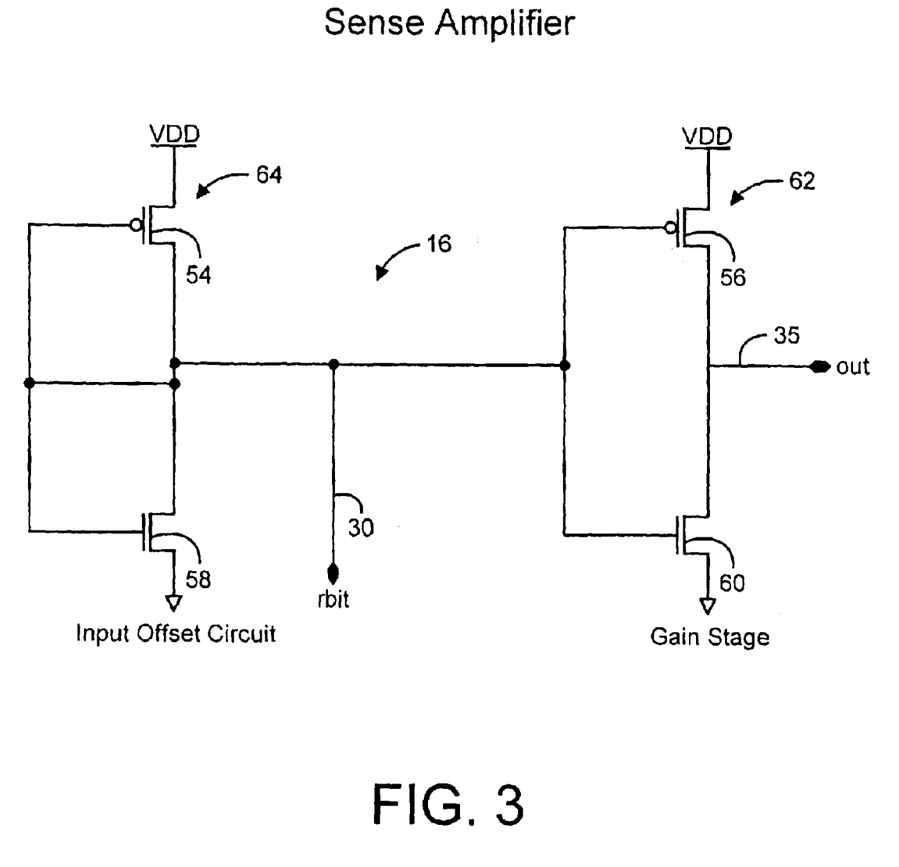
FIG. 3 illustrates one embodiment of a sense amplifier architecture in accordance with the present invention.

One embodiment of sense amplifier 16 is illustrated in FIG. 3. In this embodiment, sense amplifier 16 includes two coupled inverters designated gain stage or inverter 62 and input offset stage 64. An inverter inverts its input, so that if a 0 is input a 1 is output. The inverter and offset pair includes two PFet transistors 54 and 56 and two NFet transistors 58 and 60. Transistors 56 and 60 comprise the gain stage 62, where the gate of transistor 56 is coupled to the gate of transistor 60 and rbit 30. Transistor 56 is also coupled to the drain of transistor 60 and out 35. Transistors 54 and 58 comprise the input offset stage 64, where the gate of transistor 54 is coupled to the gate of transistor 58, the drain of transistor 58 and coupled to its own drain, along with the gates of transistors 56 and 60, and rbit 30.

The input offset circuit or "inverter" 64 is used to bias the input of the gain stage or inverter 62, sensing a small bitline swing and reducing the amount of voltage required to fully switch the sense amplifier. The offset circuit 64 is set to a DC voltage level on the order of about 100 mV, for example, above the trip point of the gain stage or inverter 62 when no current is present on rbit 30, while moving to about 100 mV below the inverter trip point of the gain stage 62 when a current is present on rbit 30. The trip point is the voltage level where the gain stage's output voltage is equal to its input voltage.

This 200 mV total bitline swing around the gain stage inverter trip point is sufficient to almost fully switch the gain stage (within about 50–100 mV from the power supply rails) to CMOS logic levels. The output stage (not shown) follows the sense amplifier stage and fully restores the voltage levels to interface with standard CMOS gating.

Figure 4:
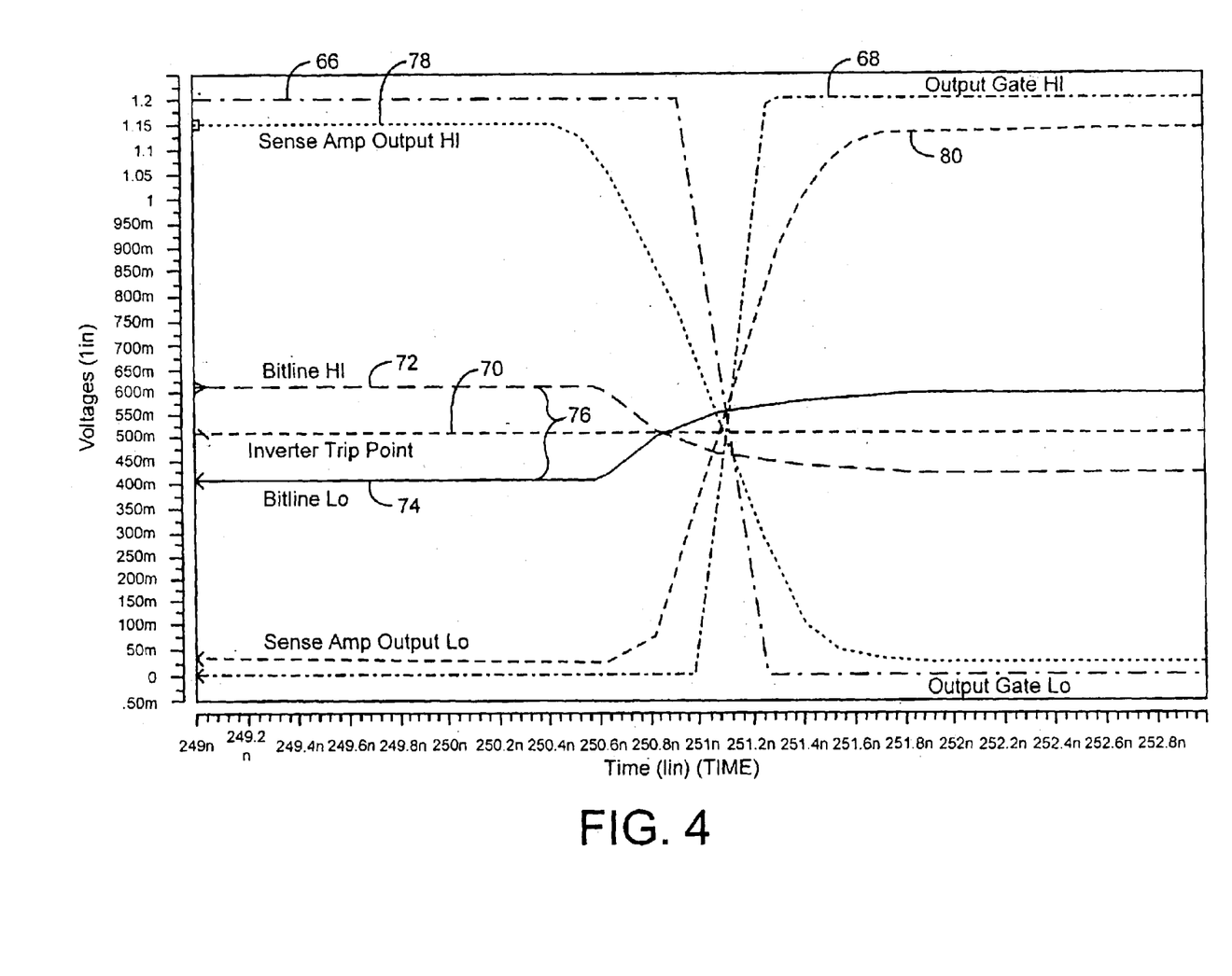
FIG. 4 illustrates a graph depicting the wave forms for the sense amplifier, the output gate, the inverter trip point for the gain stage and the bitline swing.

Waveforms of one embodiment of the above-described circuit are illustrated in FIG. 4. Large and small dashed lines (------) 66 and 68 represent the voltage swing of the output gate from about 0 to about 1.2 volts (also referred to as the power supply rails), where line 66 represents output gate HI to Lo and line 68 represents output gate Lo to HI. Dashed line (- - - -) 70 represents the trip point of the gain stage of inverter 62 set approximately midway between the supply rails. The large dashed line (------) 72 represents the offset circuit 64 set to a DC voltage level (i.e., Bitline Hi) of about 100 mV above the trip point of the gain stage or inverter 62, while solid line 74 represents the offset circuit 64 set to a DC voltage level (i.e., Bitline Lo) of about 100 mV below the trip point of the gain stage or inverter 62, defining a bit line swing 76 of about 200 mV. As provided, this bitline swing 76 around the gain stage inverter trip point 70 is sufficient to almost fully switch the gain stage to CMOS logic levels. More specifically, the bitline swing switches the gain stage to within about 50–100 mV from the power supply rails as represented by sense amp output lines 78 and 80 respectively.

While only one sense amplifier 16 is illustrated, any number of sense amplifiers is contemplated, depending on the number of output channels, where one sense amplifier is employed for each output channel. It should be appreciated that there is a physical memory array and a logical memory array. The physical memory array is denoted by the terms rows and columns as discussed below while the logical memory array uses the terms "words" and "bits per word". The number of bits per word determines the number of output channels and hence the number of sense amplifiers 16. Bits per word and output channels have a one to one correlation. For example, if a particular memory has 16 bits per word, it has 16 outputs and therefore 16 sense amplifiers. Column muxing discussed below enables one to manipulate a non-performance optimized logical memory array into a more practical physical memory array implementation.

Figure 5:
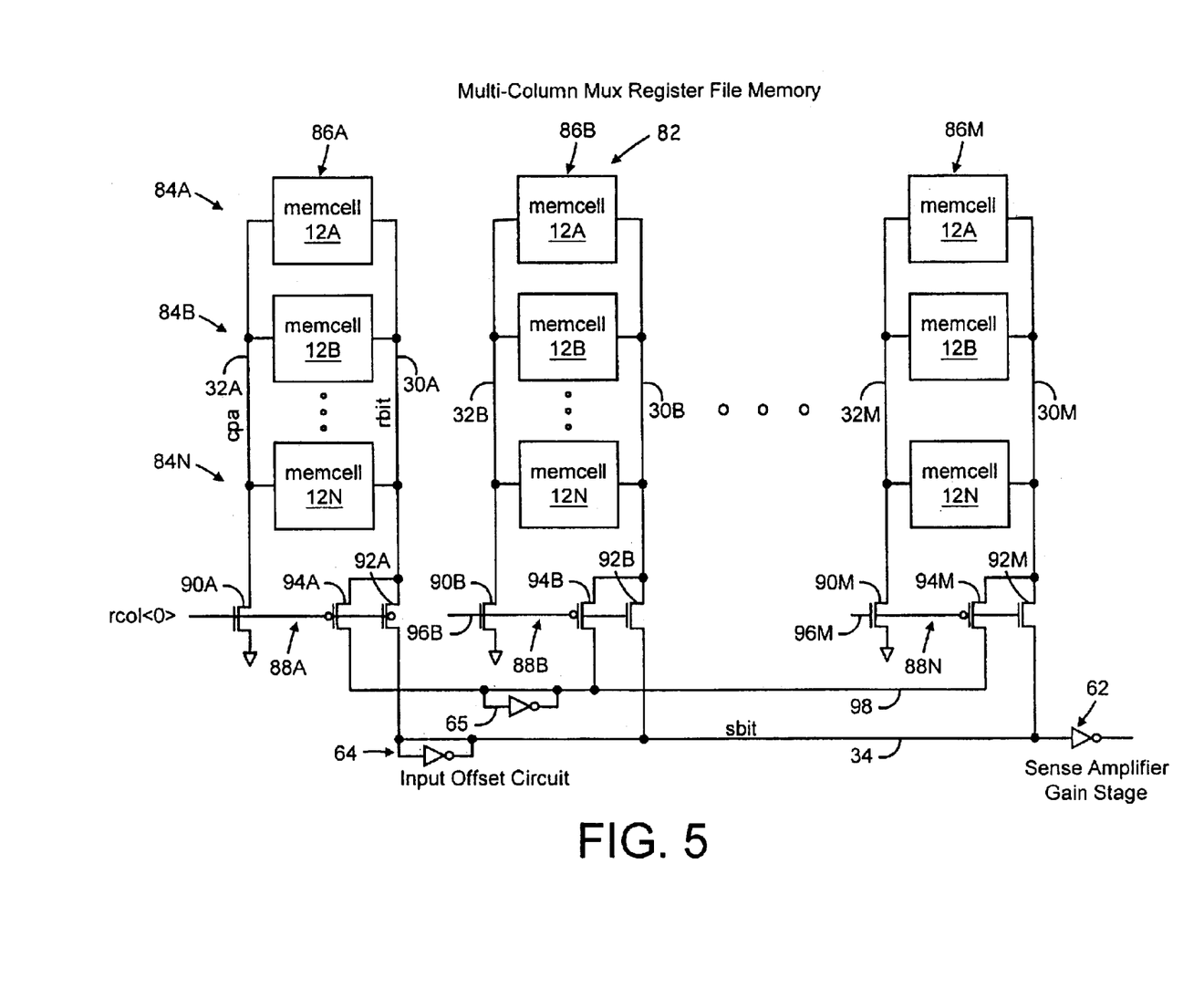
FIG. 5 illustrates one embodiment of the multi-column mux register file memory of the present invention.

Referring now to FIG. 5, one embodiment of a multi-column mux register file memory 82 is illustrated. The multi-column mux register file memory 82 is similar to the memory 10 discussed previously, wherein a plurality of storage elements 12 are arranged in N rows 84 and M columns 86, where N ranges anywhere between 2 and 256 or even up to 512, for example, while M ranges anywhere between 2 and 128, for example.

In the present example there are a total of N rows 84 and M columns 86. [It should be appreciated that the terms columns and rows are arbitrary designations that are assigned to distinguish the linear arrays extending in one direction from the linear arrays extending perpendicular thereto, and that these terms are independent of the orientation of the memory 82.

Figure 6:
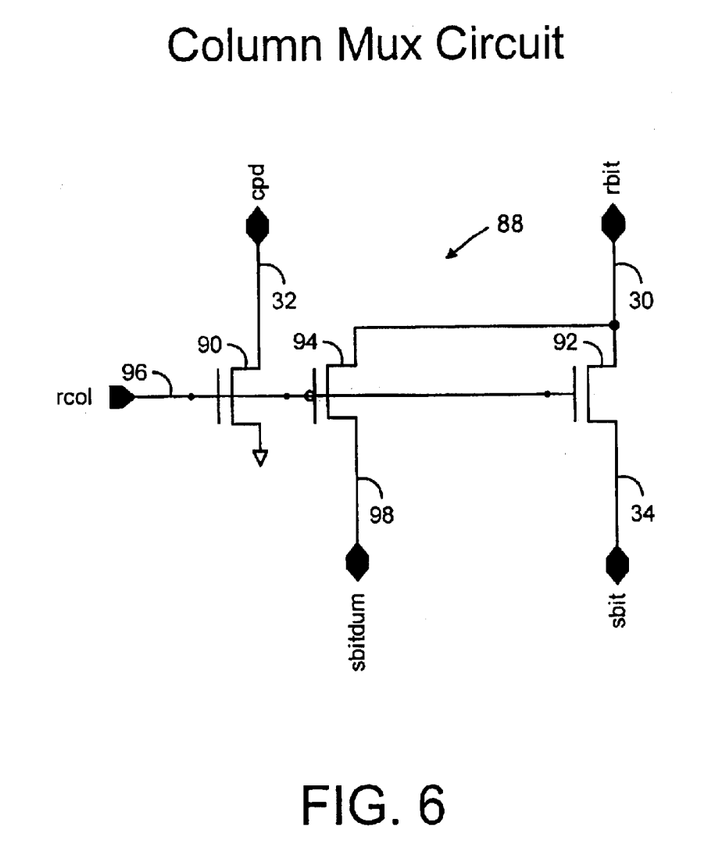
FIG. 6 illustrates one embodiment of the column mux architecture in accordance with the present invention.

FIG. 6 represents one embodiment of the circuitry that may be used to implement column muxing capability. This column mux circuit 88 is located conceptually between the memory core cells 12 and the sense amplifier 16. Column mux circuit 88 illustrates only one example of column mux 14 discussed previously. In this embodiment, the circuit 88 includes two NFet transistors 90 and 92 (the gates of which are coupled) and one PFet transistor 94 (coupled to transistor 92 as shown), for example. The node rbit 30 is the local read bitline while sbit 34 connects directly to the sense amplifier 16. Rcol 96, cpd 32 and sbitdum 98 provide the remaining signals for performing the column multiplexing function. Rcol 96 enables a given Read COLumn to be selected, cpd 32 designates the Column PullDown and sbitdum 98 provides a dummy reference (for speed purposes) for holding the unselected local bitlines in close proximity to the sense amplifier trip voltage level. The cpd node connects to and is common to each physical column as illustrated in FIG. 5.

As should be apparent from the previous discussion and the figures, the number of column mux circuits is generally dependent on the number of columns. If the memory only employs one or two columns, a column mux circuit is not employed. However, the use of a column mux is more applicable to shift memories with many words and few bits per word into a physical array with fewer rows and more columns.

Figure 7:
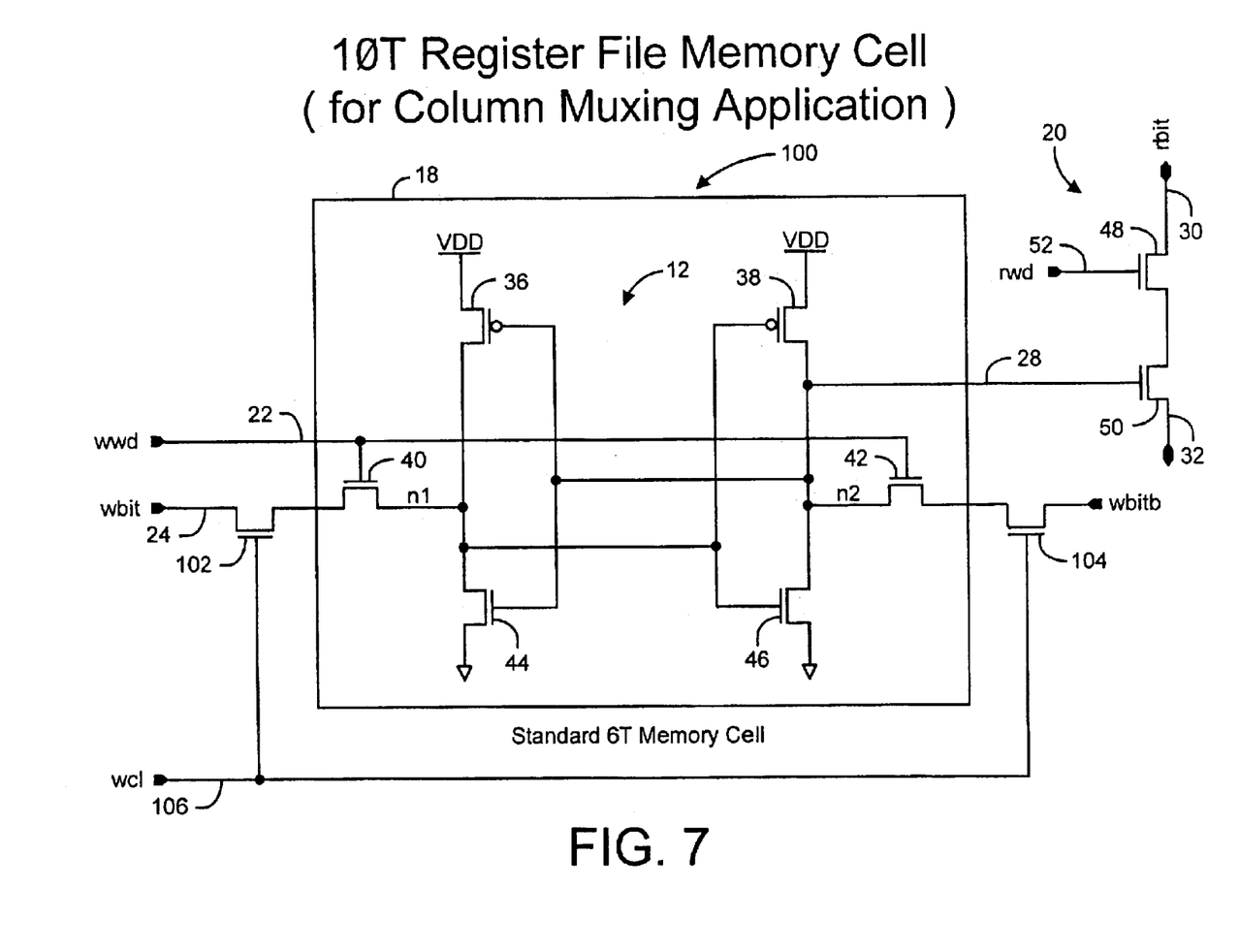
FIG. 7 illustrates one embodiment of the 10T architecture similar to the 8T architecture of FIG. 2 used with one embodiment of the column mux architecture of FIG. 6.

A 10T storage element 100 is illustrated in FIG. 7. The 8T storage element 12 illustrated in FIG. 2 is reconfigured as a 10T storage element. Two additional NFet transistors 102 and 104 are coupled to the 6T storage element 18, where the gate of transistors 102 and 104 are coupled to wcl line or node 106. Transistors 102 and 104 are not part of the read path and therefore are not discussed. However, it should be appreciated that the source of transistor 50 no longer goes to VSS as illustrated in FIG. 2, but now is coupled to the cpd node 32. It should be appreciated that the 8T storage element is generally used with memories with no column muxing (i.e. CM1), while the 10T storage element is generally used whenever a multi-column mux topology is employed.

Figure 10A:
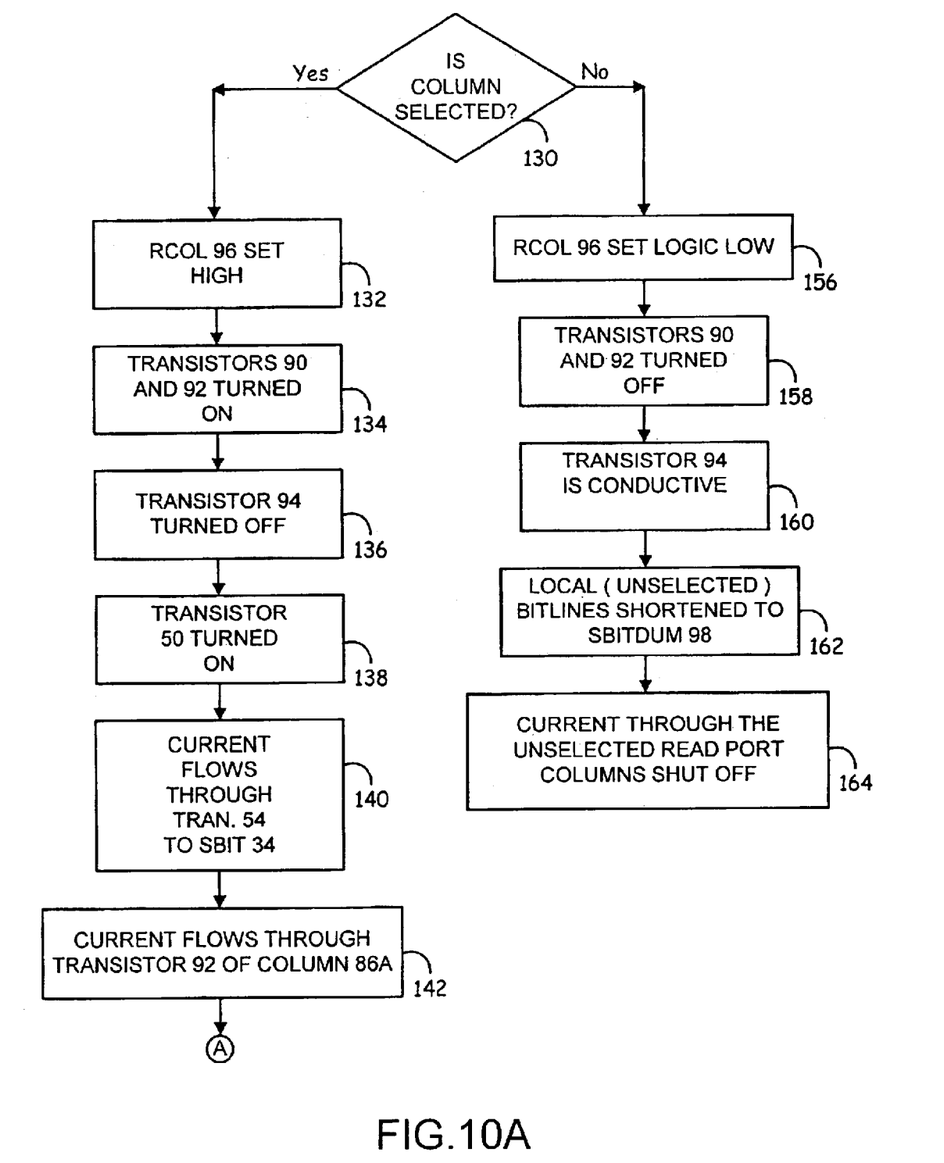
FIGS. 10A and 10B are flow diagrams illustrating one embodiment for reading data in accordance with the present invention.
Figure 10B:
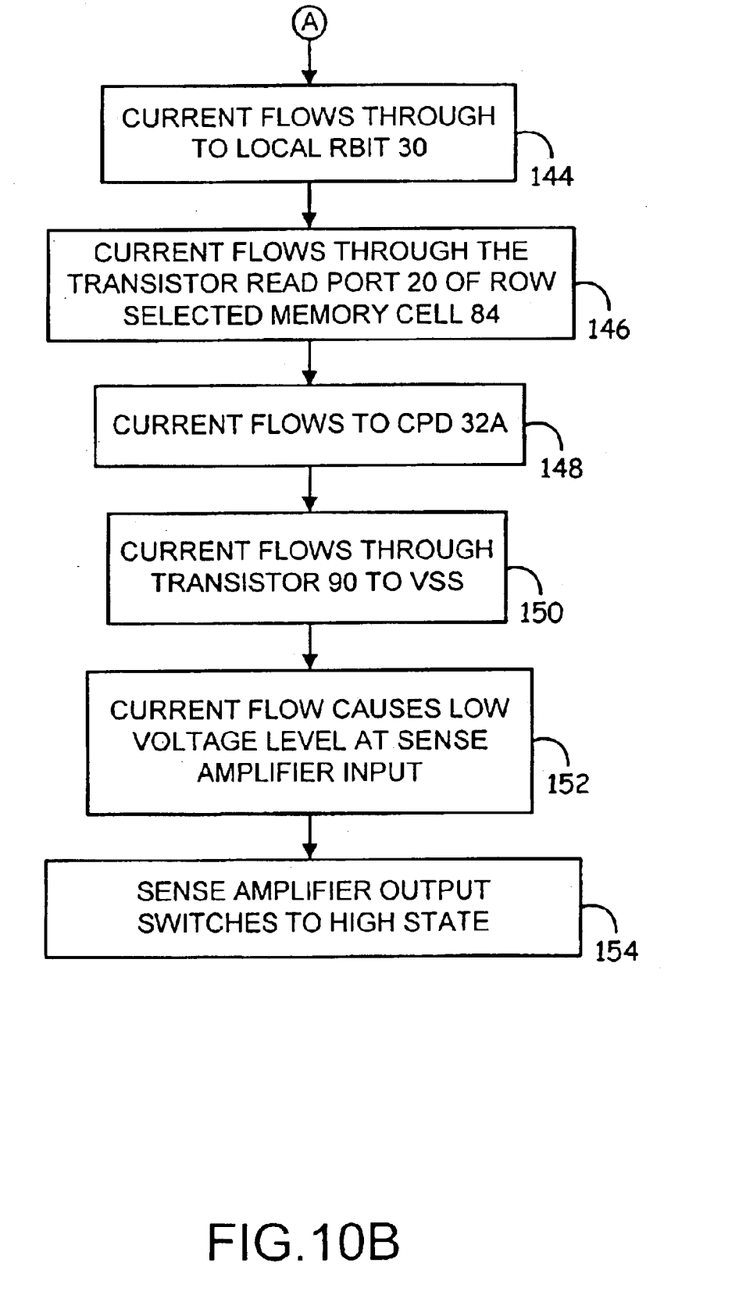

The read path of one embodiment of the present invention may be understood by referring to FIGS. 5, 10A and 10B. When a column, column 86A for example, is selected as illustrated by diamond 130, rcol 96A is set high as illustrated by block 132. This selection turns on transistors 90A and 92A while turning off transistor 94A as illustrated by blocks 134 and 136 respectively.

For a selected row (with stored data in the low or logic 0 state) transistor 50 (not shown in FIG. 5) is ON as illustrated by block 138. Current flows through transistor 54 (See FIG. 3) to sbit 34 as illustrated by block 140. The current continues through transistor 92A of column 86A to the local bitline or rbit 30 as illustrated by blocks 142 and 144 respectively, which connects to all the storage elements of a given physical column. The current is transmitted through the read port 20 of the row selected storage element 84 to cpd 32A and through transistor 90A to VSS as illustrated by blocks 146, 148 and 150 respectively. This current flow will cause a low voltage level at the input of the sense amplifier that is lower than the sense amplifier trip point and the sense amplifier output will switch to a high state as illustrated by blocks 152 and 154 respectively.

Due to the fact that the local bitline or rbit is relatively heavily loaded, the combination of column muxing along with a small swing on rbit 30 translates to a significant performance improvement in read access time. Still referring to FIGS. 5, 10A and 10B, when a column, column 86B for example, is NOT selected as illustrated by diamond 130, rcol 96B is logic low, transistors 90B and 92B are switched off and transistor 94B is conductive as illustrated by blocks 156, 158 and 160, respectively. This effectively shorts the local, unselected bitlines to sbitdum 98 while at the same time shuts off the current through the unselected read port columns (blocks 162 and 164). In other words, in order to save power the unselected read ports are non-conductive and only a single selected read port current is used to switch the sense amplifier state. This results in a predetermined and controllable total bitline voltage swing.

Sbitdum 98 is shown connected to a low power input offset circuit 65. This low power input offset circuit or biasing device is a replica of the circuit configuration used to provide the input offset in the sense amplifier circuit (i.e., the input offset circuit of FIG. 3), albeit a lower power version for power savings This added circuit preserves the speed benefits when switching between columns. Since the OFF columns are floating and represent a huge capacitive load (all unselected columns for a given output are electrically common), all local bitlines (rbit) are generally maintained close in voltage or biased to the sense amplifier trip point for quick transition when its associated column (rcol) is selected. It should be appreciated that, while an input offset circuit (including a low power input offset circuit) is illustrated and discussed, any device that holds or biases the local bitlines at a voltage close to the sense amplifier trip point is contemplated.

Figure 8:
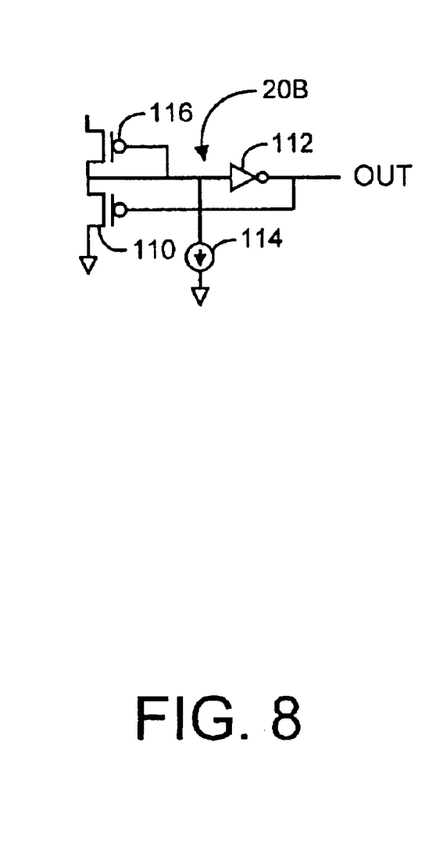
FIG. 8 illustrates an alternate embodiment of the sense amp illustrated in FIG. 3.
Figure 9:
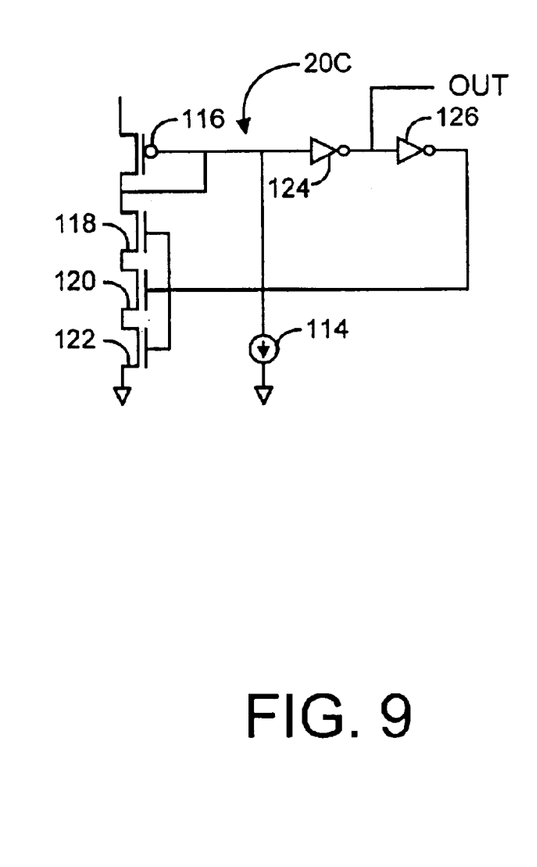
FIG. 9 illustrates yet another alternate embodiment of the sense amp illustrated in FIG. 3.

FIGS. 8 and 9 illustrate alternate embodiments of the sense amp 16, designated PFet sense amp 20B and PFet/NFet sense amp 20C respectively. Sense amp 20B comprises two series PFet transistors 108 and 110, and an inverter 112. A current source 114 is also illustrated to represent the read port current. The gate of transistor 108 is connected to the input of inverter 112, while the gate of transistor 110 is connected to the output of the inverter.

Sense amp 20C comprises series PFet and NFet transistors coupled to two inverters. Specifically, the sense amp includes a PFet transistor 116 and three NFet transistors 118, 120 and 112. The gate of transistors 116 is coupled to the input of inverter 124 having an output coupled to the input of inverter 126. The gates of the transistors 118, 120 and 122 are coupled to the output of inverter 126.

It should be appreciated that each of the three illustrated sense amps seek to perform the same task of providing a controlled offset above the trip point of the associated gain stage inverter when no current is provided by an attached (and selected) memory element, and falling to a controlled voltage level below the trip point of the same associated gain stage inverter when a memory element read current is present. Each of these embodiments controls the offset and swing characteristics across process, voltage supply and temperature.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. A memory having at least one storage element with at least one read port coupled thereto and a sensing device, said memory device comprising input offset and gain stages coupled to the read port and adapted to sense a small voltage swing, wherein said voltage swing is sufficient to switch said gain stage to within about 50 mV to 100 mV of at least one power supply rail.

2. The memory of claim 1, wherein said input offset stage is adapted to bias at least one bitline in relation to a trip point of said gain stage.

3. The memory of claim 1, wherein said input offset stage is adapted to bias said gain stage, defining a small bitline swing about a trip point of said gain stage.

4. The memory of claim 3, wherein said bitline swing is at least a portion of a total voltage supply.

5. The memory of claim 1, wherein said input offset stage comprises a low power input offset stage adapted to bias local bitlines close in voltage to a trip point of said gain stage.

6. The memory of claim 5, wherein said low power input offset stage comprises Pfet and Nfet transistors coupled together.

7. The memory of claim 1, wherein the read port comprises a pair of series transistors coupled together.

8. The memory of claim 7, wherein the read port comprises two NFet transistors coupled together.

9. The memory of claim 8, wherein a gate of one of said NFet transistors is coupled to the memory.

10. The memory of claim 8, wherein one of said NFet transistors acts as a select switch.

11. The memory of claim 7, wherein said pair of series transistors are coupled to said storage element in an isolated manner.

12. The memory of claim 11, wherein said pair of series transistors comprise at least two transistors coupled to said storage element via a gate of one of said two transistors.

13. The memory of claim 1 comprising a plurality of storage elements arranged in columns.

14. The memory of claim 13 comprising a plurality of read ports, wherein one read port is coupled to each said storage element.

15. The memory of claim 13, including a column mux circuit coupled to at least one of said columns.

16. The memory of claim 15, wherein said column mux circuit is coupled to said sensing device.

17. The memory of claim 1, wherein said sensing device comprises Pfet and Nfet transistors coupled together.

18. The memory of claim 1, wherein said sensing device comprises two PFet transistors coupled together.

19. The memory of claim 1, wherein said sensing device comprises a PFet transistor and a plurality of NFet transistors coupled together.

20. The memory of claim 1, wherein said small voltage swing is about 200 mV.

21. A multi-port register file memory having at least one read port, the memory comprising:
 a sensing device comprising input offset and gain stages coupled to the read port and adapted to sense a small voltage swing, wherein said voltage swing is sufficient to switch said gain stage to within about 50 mV to about 100 mV of at least one power supply rail.

22. The register file memory of claim 21, wherein said input offset stage biases at least one bitline in relationship to a trip point of said gain stage.

23. The register file memory of claim 21, wherein said input offset stage biases said gain stage, defining a small bitline swing about a trip point of said gain stage.

24. The register file memory of claim 23, wherein said bitline swing is at least a portion of the total voltage supply.

25. The register file memory of claim 21, wherein said input offset stage includes a low power input offset stage adapted to bias at least all local bitlines close in voltage to a trip point of said gain stage.

26. The register file memory of claim 25, wherein said low power input offset stage comprises Pfet and Nfet transistors coupled together.

27. The register file memory of claim 21, wherein the read port comprises a pair of series transistors coupled together.

28. The register file memory of claim 27, wherein the read port comprises two NFet transistors coupled together.

29. The register file memory of claim 28, wherein one of said NFet transistors acts as a select switch.

30. The register file memory of claim 21, wherein said sensing device comprises Pfet and Nfet transistors coupled together.

31. The register file memory of claim 21, wherein said sensing device comprises two PFet transistors coupled together.

32. The register file memory of claim 21, wherein said sensing device comprises a PFet transistor and a plurality of NFet transistors coupled together.

33. The register file memory of claim 21, wherein said small voltage swing is about 200 mV.

34. A circuit for use with a memory having at least one storage element, a read port coupled thereto, and a sensing amplifier, said circuit comprising input offset and gain stages coupled to said read port and adapted to sense a small voltage swing, wherein said voltage swing is sufficient to switch said gain stage to within about 50 mV to about 100 mV of at least one power supply rail.

35. A method for improving speed and increasing performance in a multi-port register file comprising sensing a small voltage swing using a sensing device having input offset and gain stages, wherein said voltage swing is sufficient to switch said gain stage to within about 50 mV to about 100 mV of at least one power supply rail.

* * * * *